(12) United States Patent
Won

(10) Patent No.: US 6,903,595 B2
(45) Date of Patent: Jun. 7, 2005

(54) HIGH VOLTAGE TRANSFER CIRCUIT

(75) Inventor: Sam Kyu Won, Ichon-Shi (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 9 days.

(21) Appl. No.: 10/736,719

(22) Filed: Dec. 16, 2003

(65) Prior Publication Data

US 2004/0239399 A1 Dec. 2, 2004

(30) Foreign Application Priority Data

May 30, 2003 (KR) ................................ 10-2003-0034695

(51) Int. Cl.[7] ............................................. H03K 17/62
(52) U.S. Cl. ..................... 327/403; 327/404; 327/589
(58) Field of Search .................... 327/403, 404, 327/306, 333, 390, 589, 427, 530, 536, 581; 307/125, 126, 130, 140; 326/80, 88, 62, 113; 365/185.18, 189.09

(56) References Cited

U.S. PATENT DOCUMENTS 4,061,929 A * 12/1977 Asano ........................ 327/589
6,597,603 B2 * 7/2003 Lambrache et al. ... 365/185.18

* cited by examiner

*Primary Examiner*—Long Nguyen
(74) *Attorney, Agent, or Firm*—Marshall, Gerstein & Borun LLP

(57) ABSTRACT

Disclosed is a method of the present invention relates to a high voltage transfer circuit. The high voltage transfer circuit includes a first high voltage switch for transferring a high voltage generated within a chip to the outside of the chip according to a clock signal and a first control signal, and a second high voltage switch for transferring the high voltage generated outside the chip to the inside of the chip according to the clock signal and a second control signal. Therefore, it is possible to easily analyze fail of an initial product without manufacturing additional PMOS transistor that withstands a high voltage.

6 Claims, 4 Drawing Sheets

HIGH VOLTAGE TRANSFER CIRCUIT

BACKGROUND

1. Field of the Invention

The present invention relates to a high voltage transfer circuit and, more particularly, to a high voltage transfer circuit that facilitates analysis into fail of an initial product, by monitoring a high voltage generated within a chip or directly applying an external high voltage to the inside of the chip using a high voltage switch having a NMOS transistor.

2. Discussion of Related Art

In order to program, erase and read a flash memory cell, it is required that voltages depending on these operations be applied to a control gate, a source, a drain and a well, respectively. For example, in order to program the flash memory cell, a high voltage must be generated using a pumping circuit within a memory chip and the high voltage has to be applied to the control gate of the memory cell selected by a decoder. At this time, the operation of the pumping circuit is verified by monitoring whether the high voltage generated by the pumping circuit is sufficient for the operation of the cell. FIG. 1 is a circuit diagram illustrating the construction of a conventional high voltage transfer circuit for the monitoring.

FIG. 1 illustrates the conventional high voltage transfer circuit for monitoring a high voltage (VPP) generated in the pumping circuit 11, which is applied to a word line of a memory cell array 13 selected by a decoder 12. A detailed construction of the conventional high voltage transfer circuit will be described in detail with reference to FIG. 1.

A first high voltage level shifter 14 selectively outputs the high voltage (VPP) generated in the pumping circuit 11 according to a test enable signal (TESTEN). A second high voltage level shifter 15 selectively outputs a voltage of a second node Q12 that keeps the potential of a monitoring pad 16, according to the test enable signal (TESTEN). First and second PMOS transistors P11 and P12, which are serially connected between a first node Q11 being the output terminal of the pumping circuit 11 and a second node Q12 being the input terminal of the monitoring pad 16, are driven by the output signals of the first and second high voltage level shifters 14 and 15, respectively, to transfer the high voltage (VPP) to the monitoring pad 16.

FIG. 2 is a circuit diagram illustrating the construction of the high voltage level shifter used in the conventional high voltage transfer circuit shown in FIG. 1, a detail configuration of which will be described as follows:

A first PMOS transistor P21 driven by the potential of a second node Q22 is connected between the output terminal VPP of the pumping circuit 11 and a first node Q21. A first NMOS transistor N21 driven by the test enable signal (TESTEN) is connected between the first node Q21 and the ground terminal Vss. A second PMOS transistor P22 driven by the potential of the first node Q21 is connected between the output terminal VPP of the pumping circuit 11 and the second node Q22. A second NMOS transistor N22 driven by an inverse signal of the test enable signal (TESTEN) that is inverted by a first inverter I21, is connected between the second node Q22 and the ground terminal Vss. Meanwhile, the first node Q21 serves as an output terminal OUT.

In the above, if the input terminal of the monitoring pad 16 is connected in place of the output terminal VPP of the pumping circuit 11, it operates as the second high voltage level shifter.

The method of driving the first high voltage level shifter constructed above will be described below.

If the test enable signal (TESTEN) is applied as a HIGH state, the first NMOS transistor N21 is turned on and the potential of the first node Q21 maintains a LOW state. Meanwhile, the test enable signal (TESTEN) applied as the HIGH state is inverted to a LOW state through a first inverter I21. The second NMOS transistor N22 is turned off by the signal that was inverted to the LOW state. The second PMOS transistor P22 is turned on by the potential of the first node Q21 that keeps the LOW state, so that the high voltage (VPP) is applied to the second node Q22. Further, the first PMOS transistor P21 is turned off by the potential of the second node Q22 that keeps the HIGH state since the high voltage (VPP) is applied to the second node Q22. Therefore, the potential of the first node Q21 maintains the LOW state and this potential becomes a signal that is outputted through the output terminal OUT.

Meanwhile, as the second high voltage level shifter also operates in the same manner as above, it outputs a signal of a LOW state if the test enable signal (TESTEN) is applied as a HIGH state.

In the conventional high voltage transfer circuit as above, if the test enable signal (TESTEN) is applied as a HIGH state in the test mode for monitoring the high voltage generated in the pumping circuit, the first and second high voltage level shifters 12 and 13 are driven to output a signal of a LOW state. The first and second PMOS transistors P11 and P12 are thus driven to supply the high voltage (VPP) to the monitoring pad 16. Furthermore, the operation of the pumping circuit 11 is verified by measuring the high voltage (VPP) supplied to the monitoring pad 16.

Since the PMOS transistor could not transfer the high voltage of 20V or higher in view of its characteristic, however, the conventional circuit that transfers the high voltage through the PMOS transistor driven by the high voltage level shifter could not transfer the high voltage of 20V or higher that is generated within a current NAND type flash memory chip. For this reason, it is impossible to detect fail of the high voltage flash memory device. In order to make this possible, therefore, it is necessary to develop a new PMOS transistor that can withstand the high voltage of 20V or higher.

SUMMARY OF THE INVENTION

The present invention is contrived to solve the aforementioned problems.

The present invention is directed to a high voltage transfer circuit capable of verifying the operation of a pumping circuit within a chip by transferring a high voltage of 20V or higher generated in the pumping circuit to the outside of the chip.

According to a preferred embodiment of the present invention, there is provided a high voltage transfer circuit capable of verifying the operation of the pumping circuit within the chip, by transferring the high voltage of 20V or higher generated in the pumping circuit to the outside of the chip using a switch that does not utilize a PMOS transistor.

The present invention is concerned with a high voltage transfer circuit capable of transferring the high voltage generated outside a chip to the inside of the chip according to an operating mode even without operating the pumping circuit.

One aspect of the present invention is to provide a high voltage transfer circuit, including a first high voltage switch for transferring a high voltage generated within a chip to the outside of the chip according to a clock signal and a first control signal, and a second high voltage switch for transferring the high voltage generated outside the chip to the inside of the chip according to the clock signal and a second control signal.

According to another aspect of the present invention, there is provided a high voltage transfer circuit, including a pumping circuit for generating a high voltage necessary for a flash memory cell to supply the voltage to an internal circuit, a high voltage pad for receiving the high voltage generated from the pumping circuit or the high voltage generated from the outside, a first high voltage switch for transferring the high voltage generated from the pumping circuit to the high voltage pad according to a clock signal and a first control signal in a monitoring mode, and a second high voltage switch for transferring the high voltage supplied to the high voltage pad from the outside to an internal circuit according to the clock signal and a second control signal in an external voltage supply mode.

BRIEF DESCRIPTION OF THE DRAWINGS

The above and other objects, features and advantages of the present invention will become apparent from the following description of preferred embodiments given in conjunction with the accompanying drawings, in which.

DETAILED DESCRIPTION OF PREFERRED EMBODIMENTS

Figure 1:
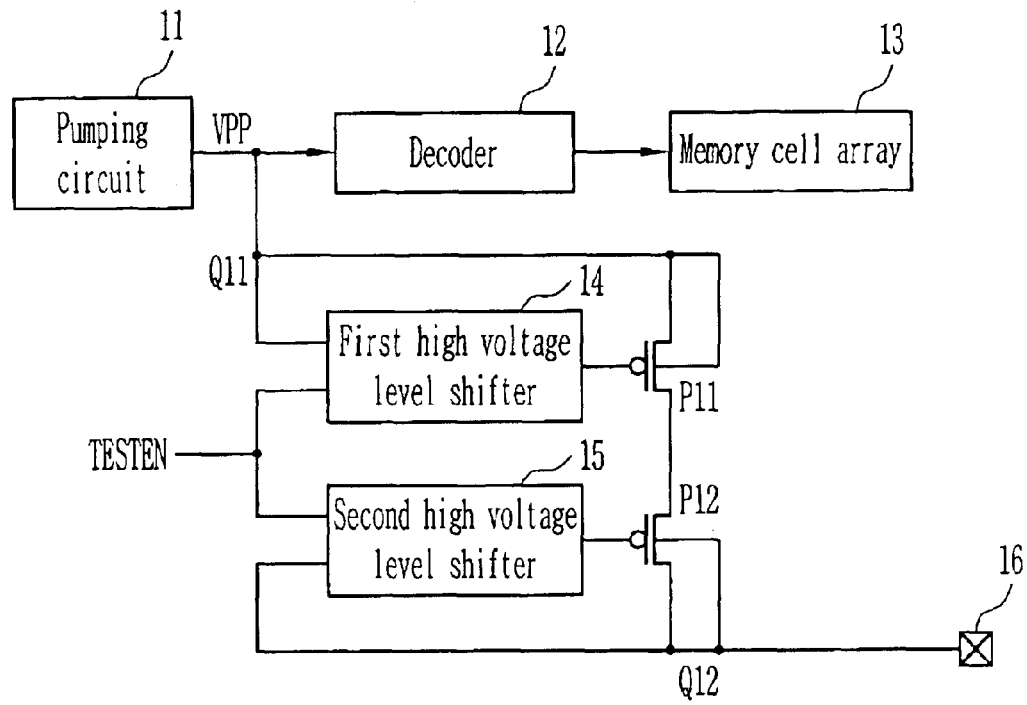
FIG. 1 is a circuit diagram illustrating the construction of a conventional high voltage transfer circuit.
Figure 2:
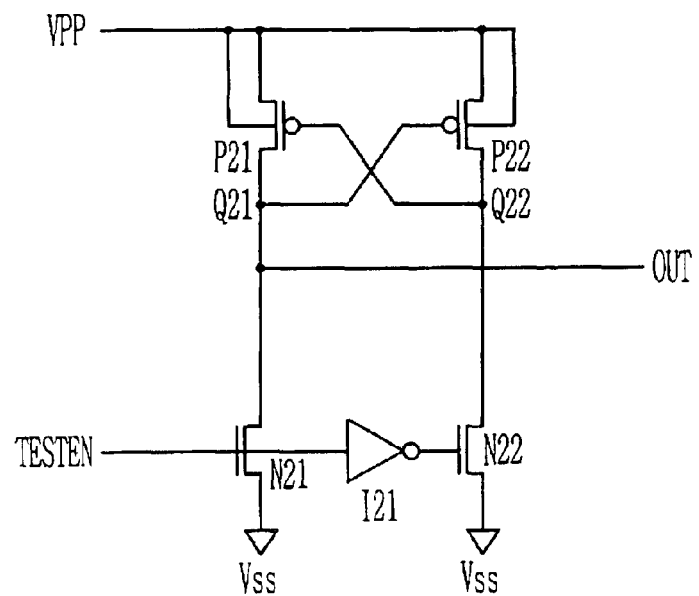
FIG. 2 is a circuit diagram illustrating the construction of a high voltage level shifter used in the conventional high voltage transfer circuit.

The present invention will now be described in detail in connection with preferred embodiments with reference to the accompanying drawings, in which like reference numerals are used to identify the same or similar parts.

Figure 3:
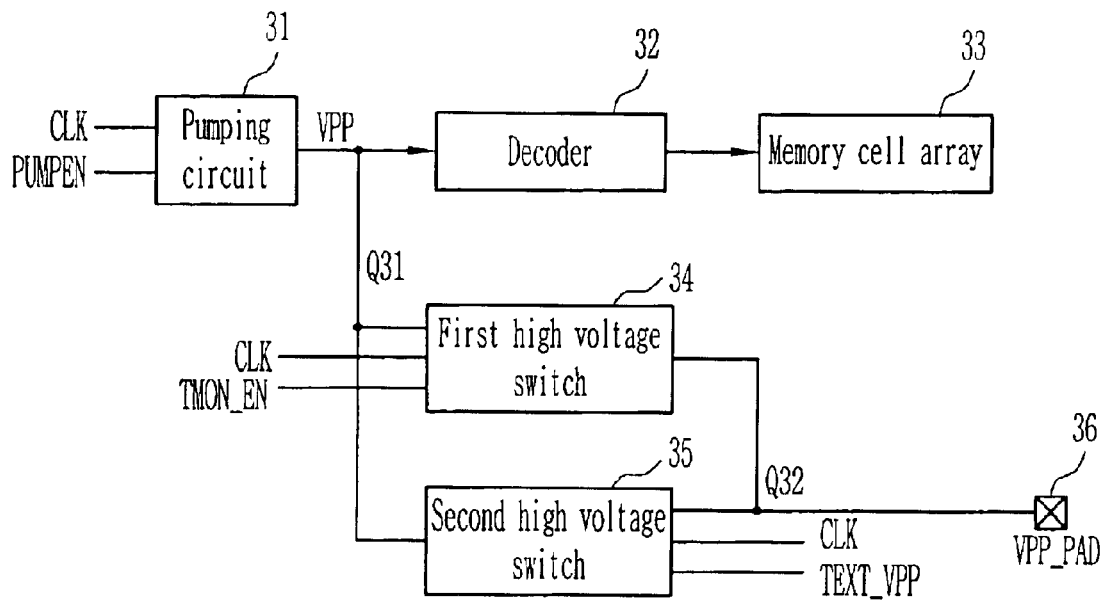
FIG. 3 is a circuit diagram illustrating the construction of a high voltage transfer circuit according to an embodiment of the present invention.

FIG. 3 is a circuit diagram illustrating the construction of a high voltage transfer circuit according to an embodiment of the present invention. In FIG. 3, in order to monitor a high voltage (VPP) generated in a pumping circuit 31 that is applied to a word line of a memory cell array 33 selected by a decoder 32 according to an operating mode, the high voltage transfer circuit transfers the high voltage (VPP) to the outside of a chip or transfers the high voltage generated outside the chip to the inside of the chip.

The pumping circuit 31 is driven by a clock signal (CLK) and a pumping enable signal (PUMPEN) to generate the high voltage (VPP). A first high voltage switch 34 is driven by the clock signal (CLK) and a high voltage-monitoring signal (TMON_EN) to supply the high voltage (VPP) generated in the pumping circuit 31 to a high voltage pad 36. A second high voltage switch 35 is driven by the clock signal (CLK) and an external voltage application signal (TEXT_VPP) to apply the high voltage supplied from the outside through the high voltage pad 36 to a first node Q31. The high voltage pad 36 receives the high voltage (VPP) generated in the pumping circuit 31 in a monitoring mode and applies the high voltage supplied from the outside to the first node Q31 in an external voltage application mode. In the above, the high voltage-monitoring signal (TMON_EN) generated in the monitoring mode is a signal for verifying the operation of the pumping circuit 31 by monitoring the pumping voltage (VPP) generated from the pumping circuit 31. Furthermore, the external voltage application signal (TEXT_VPP) generated in the external voltage application mode is a signal that is supplied to the internal circuit and cell by directly applying the high voltage from the outside without operating the pumping circuit 31.

Figure 4:
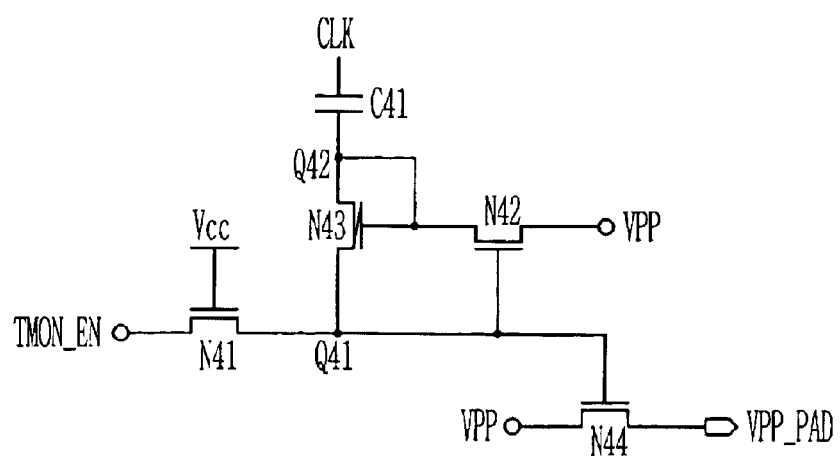
FIG. 4 is a circuit diagram illustrating the construction of a first high voltage switch used in the high voltage transfer circuit according to an embodiment of the present invention.

FIG. 4 is a circuit diagram illustrating the construction of a first high voltage switch used in the high voltage transfer circuit according to an embodiment of the present invention.

A first NMOS transistor N41 driven by the power supply voltage (Vcc) supplies the potential depending on the monitoring enable signal (TMON_EN) to a first node Q41. A first capacitor C41 is charged by a clock signal (CLK) to control the potential of a second node Q42. A second NMOS transistor N42 connected between the output terminal VPP of the pumping circuit and the second node Q42 is driven by the potential of the first node Q41 to apply the pumping voltage (VPP) to the second node Q42. A third NMOS transistor N43 connected between the second node Q42 and the first node Q41 is driven by the potential of the second node Q42 to supply charges charged in the first capacitor C41 to the first node Q41. A fourth NMOS transistor N44 driven depending on the potential of the first node Q41 supplies the pumping voltage (VPP) to the high voltage pad VPP_PAD.

Figure 5:
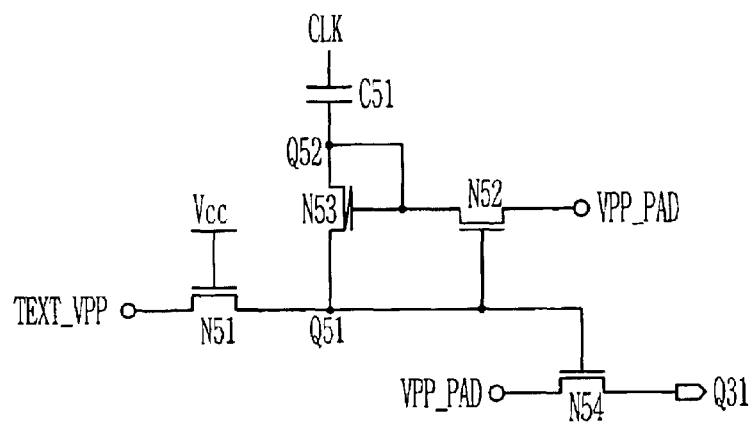
FIG. 5 is a circuit diagram illustrating the construction of a second high voltage switch used in the high voltage transfer circuit according to an embodiment of the present invention.

FIG. 5 is a circuit diagram illustrating the construction of a second high voltage switch used in the high voltage transfer circuit according to an embodiment of the present invention.

A first NMOS transistor N51 driven by the power supply voltage (Vcc) supplies the potential depending on the external voltage application signal (TEXT_VPP) to a first node Q51. A first capacitor C51 is charged by a clock signal (CLK) to control the potential of a second node Q52. A second NMOS transistor N52 connected between the high voltage pad VPP_PAD and a second node Q52 is driven by the potential of the first node Q51 to apply an external high voltage applied through the high voltage pad VPP_PAD to the second node Q52. A third NMOS transistor N53 connected between the second node Q52 and the first node Q51 is driven by the potential of the second node Q52 to supply charges charged in the first capacitor C51 to the first node Q51. A fourth NMOS transistor N54 driven depending on the potential of the first node Q51 supplies the external high voltage applied through the high voltage pad VPP_PAD to the internal circuit and cells.

Figure 6:
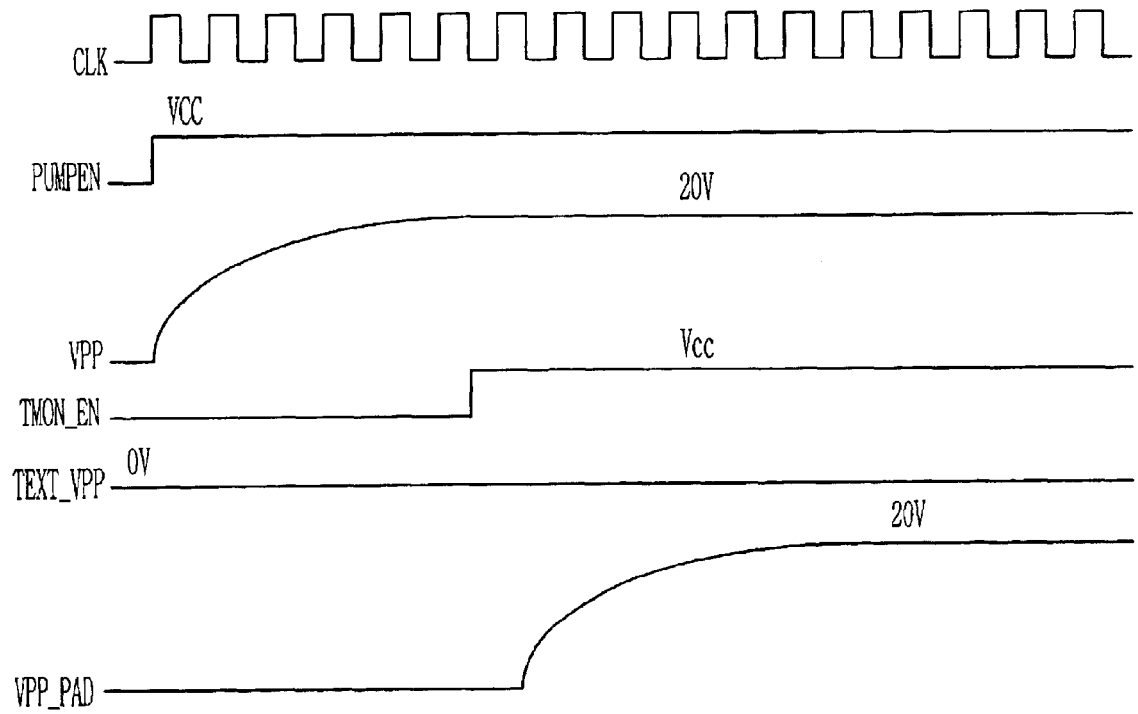
FIG. 6 shows a waveform when the high voltage transfer circuit operates in a monitoring mode according to an embodiment of the present invention.

The operation in the monitoring mode of the high voltage transfer circuit constructed above according to the present invention will be described with reference to the circuit diagrams shown in FIG. 3 and FIG. 4 and an operating waveform shown in FIG. 6.

If the pumping circuit 31 is driven by the clock signal (CLK) and the pumping enable signal (PUMPEN), the high voltage (VPP) of about 20V is generated. After the high voltage (VPP) is generated, if the high voltage-monitoring signal (TVPP_MON) is applied as a HIGH state and the external voltage application signal (TEXT_VPP) is applied as a LOW state, the first high voltage switch 34 operates but the second high voltage switch 34 does not operate. Therefore, the high voltage (VPP) generated from the pumping circuit 31 is supplied to the high voltage pad 36 through the first high voltage switch 34, so that the high voltage pad 36 maintains the potential of the high voltage (VPP).

The method of driving the first high voltage switch 34 will be described in detail with reference to FIG. 4. First, in a precharge operation wherein the clock signal (CLK) is applied as a LOW state and the high voltage-monitoring signal (TVPP_MON) is applied as a HIGH state, the high voltage-monitoring signal (TVPP_MON) applied as the potential of the power supply voltage (Vcc) is supplied to the first node Q41 through the first NMOS transistor N41 that keeps turned on by the power supply voltage (Vcc). Therefore, the first node Q41 keeps a given potential (Vcc−$V_{TH1}$). The second NMOS transistor N42 is turned on by the potential of the first node Q41 keeping the given potential (Vcc−$V_{TH1}$), so that the given potential (Vcc−$V_{TH1}$) is applied to the second node Q42. Accordingly, the second node Q42 maintains a given potential (Vcc−$V_{TH1}$−$V_{TH2}$).

In the pumping operation in which the clock signal (CLK) is applied as a HIGH state, the second node Q42 maintains a given potential (Vcc+α Vcc−$V_{TH1}$−$V_{TH2}$) depending on a voltage (α Vcc) charged into the capacitor C41. Furthermore, this potential is supplied to the first node Q41 through the third NMOS transistor N43 that is diode-connected. As a result, the first node Q41 keeps a given potential (Vcc+α Vcc−$V_{TH1}$−$V_{TH2}$−$V_{TH3}$).

As above, since the precharge operation and the pumping operation are repeated depending on the clock signal (CLK), the potential of the first node Q41 is gradually increased. If the potential increased thus is higher than the sum of the high voltage (VPP) and the threshold voltage of the fourth NMOS transistor N44, i.e., the first node Q41 keeps the given potential (VPP+$V_{TH4}$), the fourth NMOS transistor N44 is turned on and the high voltage (VPP) is applied to the high voltage pad VPP_PAD.

Figure 7:
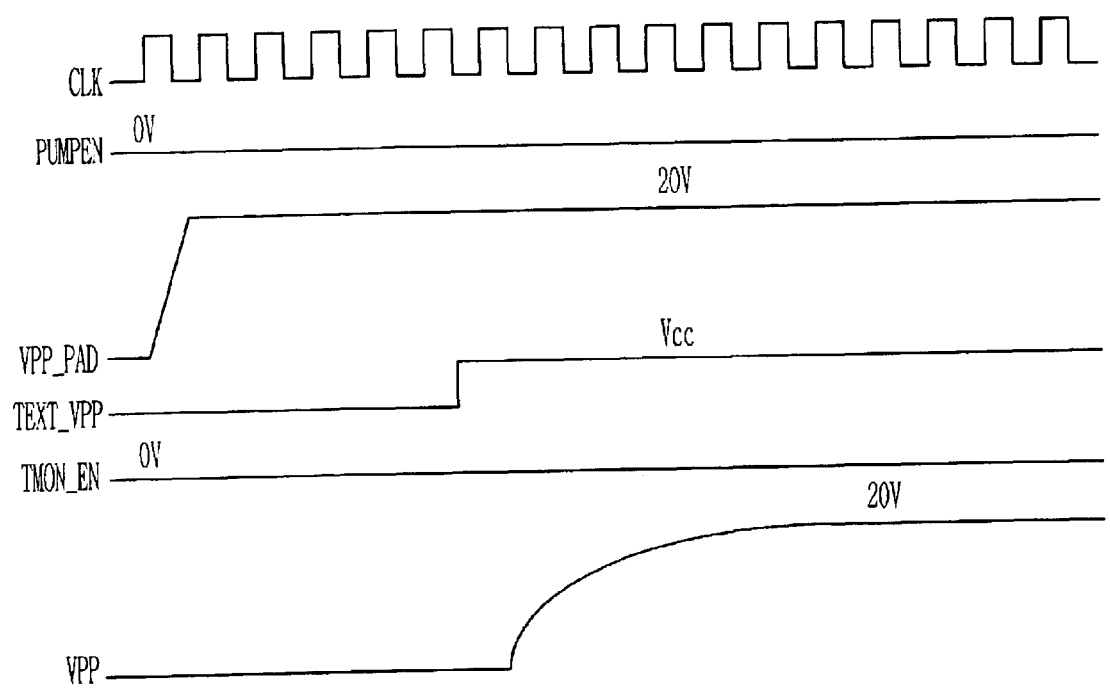
FIG. 7 shows a waveform when the high voltage transfer circuit operates in an external voltage application mode according to an embodiment of the present invention.

The operation in the external voltage application mode of the high voltage transfer circuit constructed above according to the present invention will now be described with reference to the circuit diagrams shown in FIG. 3 and FIG. 5 and a waveform shown in FIG. 7.

As the pumping enable signal (PUMPEN) is not applied, the pumping circuit 31 does not operate and the high voltage is applied to the high voltage pad 36 from the outside. After the high voltage is applied to the high voltage pad 36 from the outside, if the high voltage-monitoring signal (TVPP_MON) is applied as a LOW state and the external voltage application signal (TEXT_VPP) is applied as a HIGH state, the first high voltage switch 34 does not operate but the second high voltage switch 35 operates. Therefore, the high voltage from the outside is applied to the internal circuit and cells through the second high voltage switch 35.

The method of driving the second high voltage switch 35 will now be described in detail with reference to FIG. 5. In the precharge operation wherein the clock signal (CLK) is applied as a LOW state and the external voltage application signal (TEXT_VPP) is applied as a HIGH state, the external voltage application signal (TEXT_VPP) applied as the potential of the power supply voltage (Vcc) is supplied to the first node Q51 through the first NMOS transistor N51 that keeps turned on by the power supply voltage (Vcc). Therefore, the first node Q51 keeps the given potential (Vcc−$V_{TH1}$). The second NMOS transistor N52 is turned on by the potential of the first node Q51 that keeps the given potential (Vcc−$V_{TH1}$), so that the given potential (Vcc−$V_{TH1}$) is supplied to the second node Q52. As a result, the second node Q52 maintains the given potential (Vcc−$V_{TH1}$−$V_{TH2}$).

In the pumping operation wherein the clock signal (CLK) is applied as a HIGH state, the second node Q52 maintains the given potential (Vcc+α Vcc−$V_{TH1}$−$V_{TH2}$) depending on the voltage (α Vcc) charged into the capacitor C51. Further, this potential is supplied to the first node Q51 through the third NMOS transistor N53 that is diode-connected. Accordingly, the first node Q51 keeps the given potential (Vcc+α Vcc−$V_{TH1}$−$V_{TH2}$−$V_{TH3}$).

As above, as the precharge operation and the pumping operation are repeated according to the clock signal (CLK), the potential of the first node Q51 is increased step by step. If the potential increased as above is higher than the sum of the high voltage from the outside supplied through the high voltage pad VPP_PAD and the threshold voltage of the fourth NMOS transistor N54, the fourth NMOS transistor N54 is turned on and the high voltage from the outside is supplied to the internal circuit and cells.

According to the present invention described above, the high voltage generated within the chip is monitored or the external high voltage is directly applied to the inside, using the high voltage switch having the NMOS transistor. Therefore, the present invention has a new effect that it can easily analyze fail of an initial product without additionally manufacturing a PMOS transistor that can withstand a high voltage.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A high voltage transfer circuit located inside a chip, the high voltage transfert circuit comprising:
    a first high voltage switch for transferring a high voltage generated within the chip to an outside of the chip according to a clock signal and a first control signal; and
    a second high voltage switch for transferring the high voltage generated from the outside of the chip to the inside of the chip according to the clock signal and a second control signal.

2. The high voltage transfer circuit as claimed in claim 1, wherein the first high voltage switch comprises:
    a first switch for transferring the first control signal to a first node;
    a second switch for transferring the high voltage generated within the chip to a second node according to a potential of the first node;
    a capacitor for controlling a potential of the second node according to the clock signal;
    a third switch for transferring the potential of the second node to the first node according to the potential of the second node; and
    a fourth switch for transferring the high voltage generated within the chip to the outside of the chip according to the potential of the first node.

3. The high voltage transfer circuit as claimed in claim 1, wherein the second high voltage switch comprises:
- a first switch for transferring the second control signal to a first node;
- a second switch for transferring the high voltage generated outside the chip to a second node according to a potential of the first node;
- a capacitor for controlling a potential of the second node according to the clock signal;
- a third switch for transferring the potential of the second node to the first node according to the potential of the second node; and
- a fourth switch for transferring the high voltage generated from the outside of the chip to the inside of the chip according to the potential of the first node.

4. A high voltage transfer circuit, comprising:
- a pumping circuit for generating a high voltage necessary for an operation of a flash memory cell, and supplying the high voltage to an internal circuit of the high voltage transfer circuit;
- a high voltage pad for receiving the high voltage generated from the pumping circuit, or the high voltage generated from an outside of the high voltage transfer circuit;
- a first high voltage switch for transferring the high voltage generated from the pumping circuit to the high voltage pad according to a clock signal and a first control signal in a monitoring mode; and
- a second high voltage switch for transferring the high voltage supplied to the high voltage pad from the outside of the high voltage transfer circuit to the internal circuit according to the clock signal and a second control signal in an external voltage supply mode.

5. The high voltage transfer circuit as claimed in claim 4, wherein the first high voltage switch comprises:
- a first NMOS transistor driven by a power supply voltage, for transferring the first control signal to a first node;
- a second NMOS transistor for transferring the high voltage generated from the pumping circuit to a second node according to a potential of the first node;
- a capacitor for controlling a potential of the second node according to the clock signal;
- a third NMOS transistor for transferring the potential of the second node to the first node according to the potential of the second node; and
- a fourth NMOS transistor for transferring the high voltage generated from the pumping circuit to the outside of the high voltage transfer circuit according to the potential of the first node.

6. The high voltage transfer circuit as claimed in claim 4, wherein the second high voltage switch comprises:
- a first switch driven by a power supply voltage, for transferring the second control signal to a first node;
- a second NMOS transistor for transferring the high voltage generated from the outside of a high voltage transfer circuit to a second node according to the potential of the first node;
- a capacitor for controlling a potential of the second node according to the clock signal;
- a third NMOS transistor for transferring the potential of the second node to the first node according to the potential of the second node; and
- a fourth NMOS transistor for transferring the high voltage generated from the outside of the high voltage transfer circuit to the inside of the high voltage transfer circuit according to the potential of the first node.

* * * * *

UNITED STATES PATENT AND TRADEMARK OFFICE
CERTIFICATE OF CORRECTION

PATENT NO. : 6,903,595 B2
DATED : June 7, 2005
INVENTOR(S) : Sam Kyu Won

It is certified that error appears in the above-identified patent and that said Letters Patent is hereby corrected as shown below:

Column 8,
Line 22, please delete "a" and insert -- the --.

Signed and Sealed this

Twentieth Day of September, 2005

JON W. DUDAS
*Director of the United States Patent and Trademark Office*